(12) United States Patent
Reusch et al.

(10) Patent No.: US 9,685,624 B2
(45) Date of Patent: Jun. 20, 2017

(54) OPTOELECTRONIC COMPONENT WITH ORGANIC AND INORGANIC CHARGE GENERATING LAYERS AND METHOD FOR PRODUCING AN OPTOELECTRONIC COMPONENT

(71) Applicant: OSRAM OLED GmbH, Regensburg (DE)

(72) Inventors: Thilo Reusch, Donaustauf (DE); Carola Diez, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/419,945

(22) PCT Filed: Jun. 28, 2013

(86) PCT No.: PCT/EP2013/063715
§ 371 (c)(1),
(2) Date: Feb. 6, 2015

(87) PCT Pub. No.: WO2014/023478
PCT Pub. Date: Feb. 13, 2014

(65) Prior Publication Data
US 2015/0200378 A1 Jul. 16, 2015

(30) Foreign Application Priority Data
Aug. 8, 2012 (DE) .......... 10 2012 214 021

(51) Int. Cl.
*H01L 51/50* (2006.01)
*H01L 51/52* (2006.01)
(Continued)

(52) U.S. Cl.
CPC ........ *H01L 51/506* (2013.01); *H01L 51/5008* (2013.01); *H01L 51/508* (2013.01);
(Continued)

(58) Field of Classification Search
CPC ............ H01L 51/0072; H01L 51/5008; H01L 51/506; H01L 51/508; H01L 51/5278;
(Continued)

(56) References Cited

U.S. PATENT DOCUMENTS

| | | | |
|---|---|---|---|
| 2004/0004215 A1* | 1/2004 | Iechi ................ | H01L 51/5296 257/40 |
| 2005/0098726 A1* | 5/2005 | Peumans ............. | B82Y 10/00 250/338.1 |

(Continued)

FOREIGN PATENT DOCUMENTS

| | | |
|---|---|---|
| CN | 1703128 A | 11/2005 |
| CN | 102484922 A | 5/2012 |

(Continued)

OTHER PUBLICATIONS

Tokito, S., Noda, K., and Taga, Y. Metal oxides as a hole-injecting layer for an organic electroluminescent device. J. Phys. D: Appl. Phys., 29 (1996) 2750-2753.*

(Continued)

*Primary Examiner* — Lex Malsawma
*Assistant Examiner* — Gardner W Swan
(74) *Attorney, Agent, or Firm* — Viering, Jentschura & Partner mbB

(57) ABSTRACT

Various embodiments may relate to an optoelectronic component, including a first organic functional layer structure, a second organic functional layer structure and a charge generating layer structure between the first organic functional layer structure and the second organic functional layer structure. The charge generating layer structure includes a hole-conducting charge generating layer and a first electron-conducting charge generating layer. The hole-conducting charge generating layer includes or is formed from an inorganic substance or an inorganic substance mixture. The (Continued)

first electron-conducting charge generating layer includes or is formed from an organic substance or an organic substance mixture. The first electron-conducting charge generating layer includes or is formed from an organic, intrinsically electron-conducting substance.

16 Claims, 3 Drawing Sheets

(51) Int. Cl.
*H01L 51/56* (2006.01)
*H01L 51/00* (2006.01)

(52) U.S. Cl.
CPC .......... *H01L 51/5278* (2013.01); *H01L 51/56* (2013.01); *H01L 51/0072* (2013.01); *H01L 2251/301* (2013.01); *H01L 2251/303* (2013.01)

(58) Field of Classification Search
CPC ............... H01L 51/56; H01L 2251/301; H01L 2251/303
See application file for complete search history.

(56) References Cited

U.S. PATENT DOCUMENTS

| | | | |
|---|---|---|---|
| 2005/0116633 A1 | 6/2005 | Yamazaki et al. | |
| 2005/0260451 A1 | 11/2005 | Kijima | |
| 2008/0171226 A1* | 7/2008 | Noh | H01L 51/5044 428/690 |
| 2008/0297036 A1 | 12/2008 | Noh et al. | |
| 2009/0072723 A1* | 3/2009 | Shioya | H01L 51/5088 313/504 |
| 2009/0167172 A1 | 7/2009 | Yamashita et al. | |
| 2009/0174315 A1 | 7/2009 | Furukawa et al. | |
| 2010/0328928 A1* | 12/2010 | Matsukura | G02F 1/133603 362/97.1 |
| 2011/0079273 A1* | 4/2011 | Arango | H01L 51/4246 136/252 |
| 2011/0186825 A1 | 8/2011 | Egawa et al. | |
| 2011/0248249 A1* | 10/2011 | Forrest | H01L 51/5016 257/40 |
| 2011/0315968 A1 | 12/2011 | Nowatari et al. | |
| 2012/0012820 A1 | 1/2012 | Endo | |

FOREIGN PATENT DOCUMENTS

| | | |
|---|---|---|
| DE | 102009016957 A1 | 12/2010 |
| EP | 1983805 A1 | 10/2008 |
| EP | 2023692 A1 | 2/2009 |
| EP | 2366753 A1 | 9/2011 |
| KR | 1020080105640 A | 12/2008 |
| KR | 1020110099645 A | 9/2011 |
| WO | 2010062643 A1 | 6/2010 |
| WO | 2011027657 A1 | 3/2011 |

OTHER PUBLICATIONS

Banerjee, A. N. and Chattopadhyay, K. K. Reactive sputtered wide-bandgap p-type semiconducting spinel AB2O4 and delafossite ABO2 thin films for "transparent electronics". Depla, D. and Mahieu, S. Reactive Sputter Deposition. Springer, Berlin (2008) 413-484.*
Zakutayev, A. et al. Tunable properties of wide-band gap p-type BaCu(Ch1-xCh'x)F (Ch=S,Se,Te) thin-film solid solutions. Thin Solid Films, 518 (2010) 5494-5500.*
Chen, H. Y. et al. Indium-doped molybdenum oxide as a new p-type transparent conductive oxide. J. Mater. Chem., 21 (2011) 5745-5752.*
Peumans, P. and Forrest, S. R. Very-high-efficiency double-heterostructure copper phthalocyanine/C 60 photovoltaic cells. App. Phys. Lett., 79 (2001) 126-128.*
Gao, H. et al. Theoretical characterization of a typical hole/exciton-blocking material bathocuproine and its analogues. J. Phys. Chem. A, 112 (2008) 9097-9103.*
Yoshida, H. Electron transport in bathocuproine interlayer in organic semiconductor devices. J. Phys. Chem. C, 119 (2015) 24459-24464.*
A.N. Banerjee A, K.K. Chattopadhyay: Recent developments in the emerging field of crystalline. In: Progress in Crystal Growth and Characterization of Materials, 50, 2005, 52-105. http://www.google.de/url?sa=t&rct=j&q=nio%20agcoo2%20oled&source=web&cd=1&cad=rja&sqi=2&ved=0CDAQFjAA&url=http%3A%2Fwww.researchgate.net%2Fpublication%2F233783226_Recent_developments_in_the_emerging_field_of_crystalline_p-type_transparent_conducting_ox [accessed on Feb. 15, 2013.].
Andriy Zakutayev [u.a.]: Electronic properties of BaCuChF „Ch=S,Se,Te . . . surfaces and BaCuSeF/. In: Journal of Applied Physics, 107, 2010, 103713-1-8. http://144.206.159.178/ft/18414/933120/16264405.pdf [accessed on Feb. 15, 2013.].
Hemant Dixit: First-principles electronic structure calculations of transparent conducting oxide materials. Universiteit Antwerpen : Proefschrift, Jul. 2012. 1-171.—ISBN X. http://www.cmt.ua.ac.be/ua/HemantDixit.pdf [accessed on Feb. 15, 2013.].
German Search Report based on Application No. 10 2012 214 021.2(5 Pages) dated Feb. 15, 2013 (Reference Purpose Only).
International Search Report in the PCT application PCT/EP2013/063715 (3 pages), dated Oct. 31, 2014.
Korean Office Action based on Application No. 10-2015-7005983(5 Pages and 6 pages of English translation) dated Mar. 31, 2016 (Reference Purpose Only).
Chinese Office Action based on application No. 2013800423762 (13 pages) dated Oct. 10, 2016 (for reference purpose only).
Chinese Office Action based on application No. 201380042376.2 (14 pages and 6 pages of English translation) dated Apr. 5, 2017 (Reference Purpose Only).

* cited by examiner

OPTOELECTRONIC COMPONENT WITH ORGANIC AND INORGANIC CHARGE GENERATING LAYERS AND METHOD FOR PRODUCING AN OPTOELECTRONIC COMPONENT

RELATED APPLICATIONS

The present application is a national stage entry according to 35 U.S.C. §371 of PCT application No.: PCT/EP2013/063715 filed on Jun. 28, 2013, which claims priority from German application No. 10 2012 214 021.2 filed on Aug. 8, 2012, and is incorporated herein by reference in its entirety.

TECHNICAL FIELD

Various embodiments relate to an optoelectronic component and a method for producing an optoelectronic component.

BACKGROUND

An optoelectronic component (e.g. an organic light emitting diode (OLED), for example a white organic light emitting diode (WOLED), a solar cell, etc.) on an organic basis is usually distinguished by its mechanical flexibility and moderate production conditions. Compared with a component composed of inorganic materials, an optoelectronic component on an organic basis can be produced potentially cost-effectively on account of the possibility of large-area production methods (e.g. roll-to-roll production methods).

A WOLED consists e.g. of an anode and a cathode with a functional layer system therebetween. The functional layer system consists of one or a plurality of emitter layer/s, in which the light is generated, one or a plurality of charge generating layer structure/s each composed of two or more charge generating layers (CGL) for charge separation, and one or a plurality of electron blocking layers, also designated as hole transport layer(s) (HTL), and one or a plurality of hole blocking layers, also designated as electron transport layer(s) (ETL), in order to direct the current flow.

The luminance of OLEDs is limited, inter alia, by the maximum current density which can flow through the diode. In order to increase the luminance of OLEDs, it is known to combine one or a plurality of OLEDs one on top of another in series (so-called stacked or tandem OLED). By means of stacking one above another, it is possible to obtain significantly longer lifetimes in the OLED with practically the same efficiency and identical luminance, whereas with the same current density it is possible to realize N times the luminance in the case of N-OLED units. In this case, the layers at which the OLED units contact one another are accorded particular importance. An electron-conducting region of one diode and a hole-conducting region of the other diode meet at these layers. The layers between these regions, the so-called charge generating layer (CGL) structure, should be able to separate electron-hole pairs from one another and to inject electrons and holes into the OLED units in opposite directions. This enables the continuous charge transport through the OLED series circuit.

For the stacking one above another, charge generating layers consisting of a highly doped pn junction are therefore required.

In the simplest embodiment, the charge generating layer structure conventionally consists of a hole-conducting charge generating layer and a first electron-conducting charge generating layer, which are directly connected to one another, with the result that illustratively a pn junction is formed. This generates a potential jump in the pn junction or a built-in voltage.

The potential jump or the built-in voltage can be influenced by means of the work function, the doping of the layers, and also the formation of interface dipoles at the pn junction by means of the substances used.

In the pn junction, a space charge zone is formed, in which electrons of the hole-conducting charge generating layer tunnel into the first electron-conducting charge generating layer. Often the first charge generating layer is physically connected to a second charge generating layer, wherein the second electron-conducting charge generating layer is often an n-doped charge generating layer.

As a result of a voltage being applied across the pn junction in the reverse direction, in the space charge zone electrons and holes are generated which migrate into the emitter layers of the OLED units and can generate electromagnetic radiation as a result of recombination (e.g. light).

The hole-conducting charge generating layer and the electron-conducting charge generating layers can each consist of one or a plurality of organic and/or inorganic substance(s) (matrix).

In the production of the charge generating layer, the respective matrix is usually admixed with one or a plurality of organic or inorganic substances (dopants) in order to increase the conductivity of the matrix and in order to carry out potential matching or energy level matching. This doping can produce electrons (n-doped; dopants e.g. metals having a low work function, e.g. Na, Ca, Cs, Li, Mg or compounds thereof, e.g. $Cs_2CO_3$, $Cs_3PO_4$, or organic dopants from the company NOVALED, e.g. NDN-1, NDN-26) or holes (p-doped; dopant e.g. transition metal oxides, e.g. $MoO_x$, $WO_x$, $VO_x$, organic compounds, e.g. Cu(I)pFBz, F4-TCNQ, or organic dopants from the company NOVALED, e.g. NDP-2, NDP-9) as charge carriers in the matrix.

As substance of the hole-conducting charge generating layer above or on the first electron-conducting charge generating layer, use is usually made of an undoped organic substance as hole transport conductor (hole transport layer HTL), e.g. αNPD.

Furthermore, undoped hole-conducting charge generating layers are known which include a transparent metal oxide as hole-conducting substance, for example $WO_3$ or $MoO_3$.

A prerequisite for the use of a charge generating layers in an optoelectronic component are a simple construction, i.e. as few layers as possible which can be produced as easily as possible. Furthermore, a low voltage drop across the charge generating layers and a highest possible transmission of the charge generating layers are required, i.e. the lowest possible absorption losses in the spectral range of the electromagnetic radiation emitted by the OLED.

In the context of this description, an organic substance can be understood to mean a carbon compound which, regardless of the respective state of matter, is present in chemically uniform form and is characterized by characteristic physical and chemical properties. Furthermore, in the context of this description, an inorganic substance can be understood to mean a compound which, regardless of the respective state of matter, is present in chemically uniform form and is characterized by characteristic physical and chemical properties, without carbon or a simple carbon compound. In the context of this description, an organic-inorganic substance (hybrid substance) can be understood to mean a compound which, regardless of the respective state of matter, is present in chemically uniform form and is characterized by characteristic physical and chemical properties, including compound portions which contain carbon and are free of carbon. In the context of this description, the term "substance" encompasses all abovementioned substances, for example an organic substance, an inorganic substance, and/or a hybrid substance. Furthermore, in the context of this description, a substance mixture can be understood to mean something which has constituents consisting of two or more different substances, the constituents of which are very finely dispersed, for example. A substance class should be understood to mean a substance or a substance mixture composed of one or a plurality of organic substance(s), one or a plurality of inorganic substance(s) or one or a plurality of hybrid substance(s). The term "material" can be used synonymously with the term "substance".

In the context of this description, a hole-conducting charge generating layer can also be designed or understood as a hole transport layer.

In various embodiments, an electron-conducting layer of an electronic component can be understood to mean a layer in which the chemical potential of the substance or of the substance mixture of the layer is energetically closer to the conduction band than to the valence band, and in which more than half of the freely mobile charge carriers are electrons.

In various embodiments, a hole-conducting layer of an electronic component can be understood to mean a layer in which the chemical potential of the substance or of the substance mixture of the layer is energetically closer to the valence band than to the conduction band and in which more than half of the freely mobile charge carriers are holes, i.e. free orbital sites for electrons.

Unlike in the case of purely inorganic layers in semiconductor components, the molecules of organic layers can partially diffuse into other organic layers (partial layer interdiffusion), for example parts of an organic, first electron-conducting charge generating layer (e.g. HAT-CN) into an organic hole-conducting charge generating layer hole transport layer (e.g. αNPD).

When an electric field is applied to the charge generating layer structure, an additional drop of the operating voltage (and thus of the electrical power) across said layer structure is measureable by means of the layer interdiffusion. This voltage drop cannot be used for the generation of light and thus reduces the efficiency of the stacked OLEDs.

The additional voltage drop can increase with the operating period, since the diffusion of conductive molecules is directed in an electric field. This limits the operating period of organic optoelectronic components.

A further disadvantage when using organic hole-conducting charge generating layer is the low charge carrier density thereof and the relatively weak interface dipoles. The low charge carrier density leads to a higher voltage drop across said layer, i.e. the layer has a lower electrical conductivity. The often weak interface dipoles make it more difficult to separate hole and electron at the interface of the hole-conducting charge generating layer and the first electron-conducting charge generating layer.

Furthermore, organic hole-conducting charge generating layers, for example αNPD, can be thermally sensitive. The substance of the organic hole-conducting charge generating layer can for example start to crystallize, for example at temperatures of approximately 95° C. in the case of αNPD. By means of the crystallization of the substance of the organic hole-conducting charge generating layers, the layer can lose its functionalities in the charge generating layer structure, such that the optoelectronic component can become unusable.

A hole-conducting charge generating layer composed of an inorganic substance could solve the problem of the layer interdiffusion, the low conductivity, the low charge carrier separation and the temperature sensitivity. The formation of hole-conducting charge generating layers from inorganic substances has not been possible to be realized hitherto for a number of reasons. In this regard, in the case of many known inorganic substances, the electrical properties are incompatible with the electrical properties of the organic first electron-conducting charge generating layer. The work function of the inorganic substances is too high (greater than approximately 3 eV) and/or the energy of the valence band is less than the energy of the conduction band of the first electron-conducting charge generating layer in physical contact with the hole-conducting charge generating layer.

A further obstacle is presented by the generating conditions of the hole-conducting charge generating layer composed of an inorganic substance. Inorganic substances for forming the hole-conducting charge generating layer are unsuitable if the hole-conducting charge generating layer can be formed only by production conditions which are incompatible with organic layers, e.g. temperature >>100° C.

What is furthermore disadvantageous in the choice of inorganic substances for the hole-conducting charge generating layer is the optical properties thereof, e.g. the transmission. Many inorganic substances exhibit absorption in the wavelength range of between approximately 400 and approximately 650 nm and are therefore not transparent. The efficiency of the optoelectronic component is reduced as a result. For these reasons, only compromises have been able to be achieved for the transition of the hole-conducting charge generating layer with the first electron-conducting charge generating layer with electron-conductive metal oxide semiconductors.

SUMMARY

In various embodiments, an optoelectronic component and a method for producing it are provided in which a transparent, inorganic, intrinsically hole-conducting substance is used for producing the hole-conducting charge generating layer.

In various embodiments, an optoelectronic component is provided, the optoelectronic component including: a first organic functional layer structure, a second organic functional layer structure, and a charge generating layer structure between the first organic functional layer structure and the second organic functional layer structure, wherein the charge generating layer structure includes a hole-conducting charge generating layer and a first electron-conducting charge generating layer, and wherein the hole-conducting charge generating layer includes or is formed from an inorganic substance or an inorganic substance mixture, and wherein the first electron-conducting charge generating layer includes or is formed from an organic substance or an organic substance mixture.

In the context of this description, an organic substance can be understood to mean a carbon compound which, regardless of the respective state of matter, is present in chemically uniform form and is characterized by characteristic physical and chemical properties. Furthermore, in the context of this description, an inorganic substance can be understood to mean a compound which, regardless of the respective state of matter, is present in chemically uniform form and is characterized by characteristic physical and chemical properties, without carbon or a simple carbon compound. In the context of this description, an organic-inorganic substance (hybrid substance) can be understood to mean a compound which, regardless of the respective state of matter, is present in chemically uniform form and is characterized by characteristic physical and chemical properties, including compound portions which contain carbon and are free of carbon. In the context of this description, the term "substance" encompasses all abovementioned substances, for example an organic substance, an inorganic substance, and/or a hybrid substance. Furthermore, in the context of this description, a substance mixture can be understood to mean something which has constituents consisting of two or more different substances, the constituents of which are very finely dispersed, for example. A substance class should be understood to mean a substance or a substance mixture composed of one or a plurality of organic substance(s) one or a plurality of inorganic substance(s), or one or a plurality of hybrid substance(s). The term "material" can be used synonymously with the term "substance".

In one configuration, the optoelectronic component can include a second electron-conducting charge generating layer, wherein the first electron-conducting charge generating layer is arranged on or above the second electron-conducting charge generating layer or wherein the second electron-conducting charge generating layer is arranged on or above the first electron-conducting charge generating layer.

In the context of this description, a hole-conducting charge generating layer can also be designed or understood as a hole transport layer.

In various embodiments, an electron-conducting layer of an electronic component can be understood to mean a layer in which the chemical potential of the substance or of the substance mixture of the layer is energetically closer to the conduction band than to the valence band, and in which more than half of the freely mobile charge carriers are electrons.

In various embodiments, a hole-conducting layer of an electronic component can be understood to mean a layer in which the chemical potential of the substance or of the substance mixture of the layer is energetically closer to the valence band than to the conduction band and in which more than half of the freely mobile charge carriers are holes, i.e. free orbital sites for electrons.

In one configuration, the charge generating layer structure may include an interlayer between the first electron-conducting charge generating layer and the second electron-conducting charge generating layer.

In one configuration, the inorganic hole-conducting substance of the hole-conducting charge generating layer may include or be formed from an inorganic, intrinsically hole-conducting substance.

In another configuration, the inorganic, intrinsically hole-conducting substance of the hole-conducting charge generating layer can have a deposition temperature of less than approximately 100° C.

In another configuration, the inorganic, intrinsically hole-conducting substance of the hole-conducting charge generating layer may include or can be formed from BaCuSF, BaCuSeF and/or BaCuTeF or a stoichiometric variant of said compounds.

In another configuration, the inorganic, intrinsically hole-conducting substance of the hole-conducting charge generating layer may include or can be formed from NiO and/or AgCoO₂ or a stoichiometric variant of said compound.

In another configuration, the inorganic, intrinsically hole-conducting substance of the hole-conducting charge generating layer may include or can be formed from one or a plurality of copper-containing delafossites.

In another configuration, the copper-containing delafossite or the copper-containing delafossites can includes or can is formed from one or a plurality of substances of the substance group of $CuAlO_2$, $CuGaO_2$, $CuInO_2$, $CuTlO_2$, $CuY_{1-x}Ca_xO_2$, $CuCr_{1-x}Mg_xO_2$ and/or $CuO_2$ or a stoichiometric variant of said compounds.

In another configuration, the inorganic, intrinsically hole-conducting substance of the hole-conducting charge generating layer may include or can be formed from one or a plurality of substances of the substance group $ZnCo_2O_4$, $ZnRh_2O_4$ and/or $ZnIr_2O_4$ or a stoichiometric variant of said compounds.

In another configuration, the inorganic, intrinsically hole-conducting substance of the hole-conducting charge generating layer may include or can be formed from $SrCu_2O_2$ or a stoichiometric variant of said compounds.

In another configuration, the inorganic, intrinsically hole-conducting substance of the hole-conducting charge generating layer may include or can be formed from one or a plurality of substances of the substance group LaCuOS, LaCuOSe and/or LaCuOTe or a stoichiometric variant of said compounds.

In another configuration, the inorganic, intrinsically hole-conducting substance of the hole-conducting charge generating layer can have a transmission of visible light in a range of approximately 450 nm to approximately 650 nm of more than approximately 90%.

In another configuration, the hole-conducting charge generating layer can have a layer thickness in a range of approximately 1 nm to approximately 500 nm.

In another configuration, the first electron-conducting charge generating layer may include or can be formed from an intrinsically electron-conducting substance.

In another configuration, the first electron-conducting charge generating layer may include or can be formed from an organic, intrinsically electron-conducting substance.

In another configuration, the first electron-conducting charge generating layer may include an organic, intrinsically electron-conducting substance having an energetically low conduction band, wherein an energetically low conduction band has an energy magnitude (work function) of greater than approximately 3.5 eV, for example greater than approximately 4.4 eV. In another configuration, the intrinsic first electron-conducting charge generating layer may include or can be formed from a substance from the group of the substances: HAT-CN, Cu(I)pFBz, $MoO_x$, $WoO_x$, $VO_x$, $ReO_x$, F4-TCNQ, NDP-2, NDP-9, Bi(III)pFBz, F16CuPc.

In another configuration, the first electron-conducting charge generating layer may include or can be formed from a substance mixture composed of a matrix and an n-type dopant. A substance mixture composed of matrix and dopant can be formed by means of coevaporation of the substances of the matrix and of the doping onto or over a substrate.

In another configuration, the matrix of the first electron-conducting charge generating layer can be a substance selected from the group of substances: HAT-CN, Cu(I)pFBz, $MoO_x$, $WO_x$, $VO_x$, $ReO_x$, F4-TCNQ, NDP-2, NDP-9, Bi(III)pFBz, F16CuPc.

In another configuration, the n-type dopant of the first electron-conducting charge generating layer can be a substance selected from the group of substances: HAT-CN, Cu(I)pFBz, MoO$_x$, WO$_x$, VO$_x$, ReO$_x$, F4-TCNQ, NDP-2, NDP-9, Bi(III)pFBz, F16CuPc.

In another configuration, the first electron-conducting charge generating layer can have a layer thickness in a range of approximately 1 nm to approximately 500 nm.

In another configuration, the substance of the first electron-conducting charge generating layer can have a transmission of greater than approximately 90% in a wavelength range of approximately 450 nm to approximately 650 nm.

In another configuration, the second electron-conducting charge generating layer may include or can be formed from an intrinsically electron-conducting substance.

In another configuration, the substance of the second intrinsically electron-conducting charge generating layer can be a substance selected from the group of substances: NDN-1, NDN-26, MgAg, Cs$_2$CO$_3$, Cs$_3$PO$_4$, Na, Ca, K, Mg, Cs, Li, LiF.

In another configuration, the second electron-conducting charge generating layer can be formed from a substance mixture composed of matrix and n-type dopant.

In another configuration, the matrix of the second electron-conducting charge generating layer can be a substance selected from the group of substances:
NET-18, NET-5, ETM033, ETM036, BCP, BPhen;
2,2',2''-(1,3,5-benzinetriyl)-tris(1-phenyl-1-H-benzimidazole);
2-(4-biphenylyl)-5-(4-tert-butylphenyl)-1,3,4-oxadiazole, 2,9-dimethyl-4,7-diphenyl-1,10-phenanthroline (BCP);
8-hydroxyquinolinolatolithium, 4-(naphthalen-1-yl)-3,5-diphenyl-4H-1,2,4-triazole;
1,3-bis[2-(2,2'-bipyridin-6-yl)-1,3,4-oxadiazo-5-yl]benzene;
4,7-diphenyl-1,10-phenanthroline (Bphen);
3-(4-biphenylyl)-4-phenyl-5-tert-butylphenyl-1,2,4-triazole;
bis(2-methyl-8-quinolinolate)-4-(phenylphenolato)aluminum;
6,6'-bis[5-(biphenyl-4-yl)-1,3,4-oxadiazo-2-yl]-2,2'-bipyridyl;
2-phenyl-9,10-di(naphthalen-2-yl)anthracene;
2,7-bis[2-(2,2'-bipyridin-6-yl)-1,3,4-oxadiazo-5-yl]-9,9-dimethylfluorene;
1,3-bis[2-(4-tert-butylphenyl)-1,3,4-oxadiazo-5-yl]benzene;
2-(naphthalen-2-yl)-4,7-diphenyl-1,10-phenanthroline;
2,9-bis(naphthalen-2-yl)-4,7-diphenyl-1,10-phenanthroline;
tris(2,4,6-trimethyl-3-(pyridin-3-yl)phenyl)borane;
1-methyl-2-(4-(naphthalen-2-yl)phenyl)-1H-imidazo[4,5-f][1,10]phenanthroline;
phenyl-dipyrenylphosphine oxide;
naphthalenetetracarboxylic dianhydride or the imides thereof;
perylenetetracarboxylic dianhydride or the imides thereof; and
substances based on silols including a silacyclopentadiene unit.

In another configuration, the n-type dopant of the second electron-conducting charge generating layer can be a substance selected from the group of substances: NDN-26, MgAg, Cs$_2$CO$_3$, Cs$_3$PO$_4$, Na, Ca, K, Mg, Cs, Li, LiF.

In another configuration, the second electron-conducting charge generating layer can have a layer thickness in a range of approximately 1 nm to approximately 500 nm.

In another configuration, the conduction band or LUMO of the substance or substance mixture of the first electron-conducting charge generating layer can be energetically approximately equal to the valence band or HOMO of the substance or substance mixture of the second electron-conducting charge generating layer.

In another configuration, the interlayer can be formed from an inorganic substance, organic substance or an organic-inorganic hybrid substance.

In another configuration, the interlayer may include or can be formed from a substance mixture, wherein the substances of the substance mixture include from the group of substances: organic substance, inorganic substance and/or organic-inorganic hybrid substance.

In another configuration, the substance of the second electron-conducting charge generating layer can have a magnitude of the work function of greater than approximately 3 eV and an energy of the valence band or HOMO approximately equal to the energy of the conduction band or LUMO of the first electron-conducting charge generating layer in physical contact.

In another configuration, the optoelectronic component can be produced as an organic light emitting diode.

In various embodiments, a method for producing an optoelectronic component is provided, the method including: forming a first organic functional layer structure; forming a charge generating layer structure above or on the first organic functional layer structure; forming a second organic functional layer structure above or on the charge generating layer structure; wherein forming the charge generating layer structure forming a hole-conducting charge generating layer and forming a first electron-conducting charge generating layer; wherein the hole-conducting charge generating layer includes or is formed from an inorganic substance or an inorganic substance mixture, and wherein the first electron-conducting charge generating layer includes or is formed from an organic substance or an organic substance mixture.

In one configuration of the method, the method may include forming a second electron-conducting charge generating layer, wherein the first electron-conducting charge generating layer is formed on or above the second electron-conducting charge generating layer.

In one configuration of the method, forming the charge generating layer structure may include forming an interlayer between the first electron-conducting charge generating layer and the second electron-conducting charge generating layer.

In another configuration of the method, an intrinsically electron-conducting substance can be chosen as a substance for forming the first electron-conducting charge generating layer.

In another configuration of the method, the substance for forming the first electron-conducting charge generating layer can be a substance selected from the group of substances: HAT-CN, Cu(I)pFBz, MoO$_x$, WO$_x$, VO$_x$, ReO$_x$, F4-TCNQ, NDP-2, NDP-9, Bi(III)pFBz, F16CuPc.

In another configuration of the method, a substance mixture composed of matrix and dopant can be chosen as substance for forming the charge generating layer.

In another configuration of the method, as substance for forming the matrix of the first electron-conducting charge generating layer it is possible to select a substance from the group of substances: HAT-CN, Cu(I)pFBz, MoO$_x$, WO$_x$, VO$_x$, ReO$_x$, F4-TCNQ, NDP-2, NDP-9, Bi(III)pFBz, F16CuPc.

In another configuration of the method, as substance for forming the dopant of the first electron-conducting charge generating layer it is possible to select a substance from the group of substances: HAT-CN, Cu(I)pFBz, MoO$_x$, WO$_x$, VO$_x$, ReO$_x$, F4-TCNQ, NDP-2, NDP-9, Bi(III)pFBz, F16CuPc.

In another configuration of the method, the first electron-conducting charge generating layer can be formed in a region having a layer thickness of approximately 1 nm to approximately 500 nm.

In another configuration of the method, an intrinsically electron-conducting substance can be chosen as substance for forming the second electron-conducting charge generating layer.

In another configuration of the method, a substance for forming the second electron-conducting charge generating layer as intrinsically hole-conducting (electron-conducting) substance there can be a substance selected from the group of substances: NDN-1, NDN-26, MgAg, $Cs_2CO_3$, $Cs_3PO_4$, Na, Ca, K, Mg, Cs, Li, Lif.

In another configuration of the method, a substance mixture composed of matrix and n-type dopant can be chosen as substance for forming the second electron-conducting charge generating layer.

In another configuration of the method, as substance for forming the matrix of the second electron-conducting charge generating layer it is possible to select a substance from the group of substances:
NET-18, NET-5, ETM033, ETM036, BCP, BPhen;
2,2',2"-(1,3,5-benzinetriyl)-tris(1-phenyl-1-H-benzimidazole);
2-(4-biphenylyl)-5-(4-tert-butylphenyl)-1,3,4-oxadiazole, 2,9-dimethyl-4,7-diphenyl-1,10-phenanthroline (BCP);
8-hydroxyquinolinolatolithium, 4-(naphthalen-1-yl)-3,5-diphenyl-4H-1,2,4-triazole;
1,3-bis[2-(2,2'-bipyridin-6-yl)-1,3,4-oxadiazo-5-yl]benzene;
4,7-diphenyl-1,10-phenanthroline (Bphen);
3-(4-biphenylyl)-4-phenyl-5-tert-butylphenyl-1,2,4-triazole;
bis(2-methyl-8-quinolinolate)-4-(phenylphenolato)aluminum;
6,6'-bis[5-(biphenyl-4-yl)-1,3,4-oxadiazo-2-yl]-2,2'-bipyridyl;
2-phenyl-9,10-di(naphthalen-2-yl)anthracene;
2,7-bis[2-(2,2'-bipyridin-6-yl)-1,3,4-oxadiazo-5-yl]-9,9-dimethylfluorene;
1,3-bis[2-(4-tert-butylphenyl)-1,3,4-oxadiazo-5-yl]benzene;
2-(naphthalen-2-yl)-4,7-diphenyl-1,10-phenanthroline;
2,9-bis(naphthalen-2-yl)-4,7-diphenyl-1,10-phenanthroline;
tris(2,4,6-trimethyl-3-(pyridin-3-yl)phenyl)borane;
1-methyl-2-(4-(naphthalen-2-yl)phenyl)-1H-imidazo[4,5-f][1,10]phenanthroline;
phenyl-dipyrenylphosphine oxide;
naphthalenetetracarboxylic dianhydride or the imides thereof;
perylenetetracarboxylic dianhydride or the imides thereof; and
substances based on silols including a silacyclopentadiene unit.

In another configuration of the method, as substance for forming the second electron-conducting charge generating layer, the dopant can be selected as a substance from the group of substances: NDN-26, MgAg, $Cs_2CO_3$, $Cs_3PO_4$, Na, Ca, K, Mg, Cs, Li, LiF.

In another configuration of the method, the second electron-conducting charge generating layer can be formed a layer thickness in a range of approximately 1 nm to approximately 500 nm.

In another configuration of the method, the conduction band or LUMO of the substance or substance mixture of the first electron-conducting charge generating layer can be energetically approximately equal to the energy of the valence band or HOMO of the substance or substance mixture of the second electron-conducting charge generating layer.

In another configuration of the method, an inorganic substance, organic substance or organic-inorganic hybrid substance can be selected as substance for forming the interlayer.

In another configuration of the method, a substance mixture can be used as substance for forming the interlayer, wherein the substances of the substance mixture include from the group of substances: organic substance, inorganic substance and/or organic-inorganic hybrid substance.

In another configuration of the method, an intrinsically hole-conducting substance can be selected as substance for forming the hole-conducting charge generating layer.

In another configuration of the method, the inorganic, intrinsically hole-conducting substance of the hole-conducting charge generating layer can become a transmission of visible light in a range of approximately 450 nm to approximately 650 nm of more than approximately 90%.

In another configuration of the method, the step of forming the hole-conducting charge generating layer by means of depositing the inorganic intrinsically hole-conducting substance can have a temperature of less than approximately 100° C.

In another configuration of the method, as substance for forming the hole-conducting charge generating layer it is possible to select one or a plurality of substances of the substance group of BaCuSF (work function: 4.85 eV), BaCuTeF, NiO (3.7 eV), Cu-containing delafossites, for example $CuAlO_2$ (3.5 eV), $CuGaO_2$ (3.2 eV), $CuInO_2$, $ZnM_2O_4$ (M=Co, Rh, Rh, Ir, or the like), $SrCu_2O_2$ (3.3 eV), LaCuOM (M=S, Se, Te, or the like), $AgCoO_2$ (4.15 eV) or a stoichiometric variant of said compounds.

In another configuration of the method, as substance for forming the hole-conducting charge generating layer it is possible to select a substance having a magnitude of the work function of greater than approximately 3 eV and an energy of the valence band or HOMO approximately equal to the energy of the conduction band or LUMO of the first electron-conducting charge generating layer in physical contact.

In another configuration of the method, the method can furthermore include: forming an electron conductor layer, forming the second electron-conducting charge generating layer on or above the electron conductor layer, forming a second emitter layer on or above the hole-conducting charge generating layer.

In another configuration of the method, the method can furthermore include: forming a first electrode, forming the first organic functional layer structure on or above the first electrode, forming a second electrode on or above the second organic functional layer structure.

In another configuration of the method, the optoelectronic component can be produced as an organic light emitting diode.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form part of this description and show for illustration purposes specific embodiments in which the disclosure can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, an optoelectronic component can be embodied as a light emitting component, for example as an organic light emitting diode (OLED) or as an organic light emitting transistor. In various embodiments, the optoelectronic component can be part of an integrated circuit. Furthermore, a plurality of light emitting components can be provided, for example in a manner accommodated in a common housing. In various embodiments, the optoelectronic component can also be embodied as a solar cell. Even though the various embodiments are described below on the basis of an OLED, these embodiments can, however, readily also be applied to the other optoelectronic components mentioned above.

Figure 1:
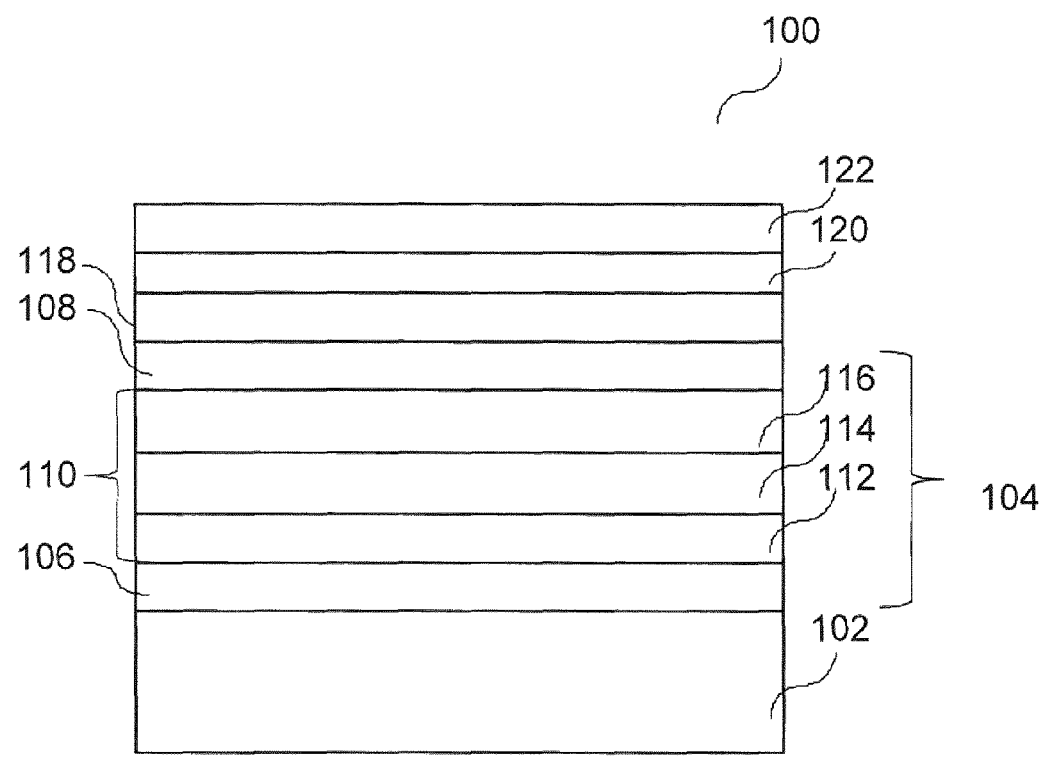
FIG. 1 shows a cross-sectional view of an optoelectronic component in accordance with various embodiments.

FIG. 1 shows a cross-sectional view of an optoelectronic component 100 in accordance with various embodiments.

The optoelectronic component 100 in the form of a light emitting component, for example in the form of an organic light emitting diode 100, can have a substrate 102. The substrate 102 can serve for example as a carrier element for electronic elements or layers, for example light emitting elements. By way of example, the substrate 102 may include or be formed from glass, quartz, and/or a semiconductor material or any other suitable material. Furthermore, the substrate 102 may include or be formed from a plastic film or a laminate including one or including a plurality of plastic films. The plastic may include or be formed from one or more polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyether sulfone (PES) and/or polyethylene naphthalate (PEN). The substrate 102 may include one or more of the materials mentioned above. The substrate 102 can be embodied as translucent or even transparent.

In various embodiments, the term "translucent" or "translucent layer" can be understood to mean that a layer is transmissive to light, for example to the light generated by the light emitting component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion. Consequently, in various embodiments, "transparent" should be regarded as a special case of "translucent".

For the case where, for example, a light emitting monochromatic or emission spectrum-limited electronic component is intended to be provided, it suffices for the optically translucent layer structure to be translucent at least in a partial range of the wavelength range of the desired monochromatic light or for the limited emission spectrum.

In various embodiments, the organic light emitting diode 100 (or else the light emitting components in accordance with the embodiments that have been described above or will be described below) can be designed as a so-called top and bottom emitter. A top and bottom emitter can also be designated as an optically transparent component, for example a transparent organic light emitting diode.

In various embodiments, a barrier layer (not illustrated) can optionally be arranged on or above the substrate 102. The barrier layer may include or consist of one or more of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer can have a layer thickness in a range of approximately 0.1 nm (one atomic layer) to approximately 5000 nm, for example a layer thickness in a range of approximately 10 nm to approximately 200 nm, for example a layer thickness of approximately 40 nm.

An electrically active region 104 of the light emitting component 100 can be arranged on or above the barrier layer. The electrically active region 104 can be understood as that region of the light emitting component 100 in which an electric current for the operation of the optoelectronic component, for example of the light emitting component 100, flows. In various embodiments, the electrically active region 104 can have a first electrode 106, a second electrode 108 and a functional layer system 110, as will be explained in even greater detail below.

In this regard, in various embodiments, the first electrode 106 (for example in the form of a first electrode layer 106) can be applied on or above the barrier layer (or on or above the substrate 102 if the barrier layer is not present). The first electrode 106 (also designated hereinafter as bottom electrode 106) can be formed from an electrically conductive material, such as, for example, a metal or a transparent conductive oxide (TCO) or a layer stack including a plurality of layers of the same metal or different metals and/or the same TCO or different TCOs. Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2Sn_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped.

In various embodiments, the first electrode 106 may include a metal; for example Ag, Pt, Au, Mg, Al, Ba, In, Ag, Au, Mg, Ca, Sm or Li, and compounds, combinations or alloys of these materials.

In various embodiments, the first electrode 106 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

In various embodiments, the first electrode 106 can provide one or a plurality of the following materials as an alternative or in addition to the abovementioned materials: networks composed of metallic nanowires and nanoparticles, for example composed of Ag; networks composed of carbon nanotubes; graphene particles and graphene layers; networks composed of semiconducting nanowires.

Furthermore, the first electrode 106 may include electrically conductive polymers or transition metal oxides or transparent electrically conductive oxides.

In various embodiments, the first electrode 106 and the substrate 102 can be formed as translucent or transparent. In the case where the first electrode 106 is formed from a metal, the first electrode 106 can have for example a layer thickness of less than or equal to approximately 25 nm, for example a layer thickness of less than or equal to approximately 20 nm, for example a layer thickness of less than or equal to approximately 18 nm. Furthermore, the first electrode 106 can have for example a layer thickness of greater than or equal to approximately 10 nm, for example a layer thickness of greater than or equal to approximately 15 nm. In various embodiments, the first electrode 106 can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case where the first electrode 106 is formed from a transparent conductive oxide (TCO), the first electrode 106 can have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case where the first electrode 106 is formed from, for example, a network composed of metallic nanowires, for example composed of Ag, which can be combined with conductive polymers, a network composed of carbon nanotubes which can be combined with conductive polymers, or from graphene layers and composites, the first electrode 106 can have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

The first electrode 106 can be formed as an anode, that is to say as a hole-injecting electrode, or as a cathode, that is to say as an electron-injecting electrode.

The first electrode 106 can have a first electrical terminal, to which a first electrical potential (provided by an energy source (not illustrated), for example a current source or a voltage source) can be applied. Alternatively, the first electrical potential can be applied to the substrate 102 and then be fed indirectly to the first electrode 106 via said substrate. The first electrical potential can be, for example, the ground potential or some other predefined reference potential.

Furthermore, the electrically active region 104 of the light emitting component 100 can have a functional layer system 110, also designated as an organic electroluminescent layer structure 110, which is applied on or above the first electrode 106.

The organic electroluminescent layer structure 110 may include a plurality of organic functional layer structures 112, 116. In various embodiments, the organic electroluminescent layer structure 110 can, however, also include more than two organic functional layer structures, for example 3, 4, 5, 6, 7, 8, 9, 10, or even more.

A first organic functional layer structure 112 and a second organic functional layer structure 116 are illustrated in FIG. 1.

The first organic functional layer structure 112 can be arranged on or above the first electrode 106. Furthermore, the second organic functional layer structure 116 can be arranged on or above the first organic functional layer structure 112. In various embodiments, a charge generating layer structure 114 (charge generation layer, CGL) can be arranged between the first organic functional layer structure 112 and the second organic functional layer structure 116. In embodiments in which more than two organic functional layer structures are provided, a respective charge generating layer structure can be provided between in each case two organic functional layer structure.

As will be explained in even greater detail below, each of the organic functional layer structure 112, 116 may include in each case one or a plurality of emitter layers, for example including fluorescent and/or phosphorescent emitters, and one or a plurality of hole-conducting layers (not illustrated in FIG. 1) (also designated as hole transport layer(s)). In various embodiments, one or a plurality of electron-conducting layers (also designated as electron transport layer(s)) can alternatively or additionally be provided.

Examples of emitter materials which can be used in the light emitting component 100 in accordance with various embodiments for the emitter layer(s) include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl))iridium III), green phosphorescent $Ir(ppy)_3$ (tris(2-phenylpyridine)iridium III), red phosphorescent Ru $(dtb-bpy)_3*2(PF_6)$ (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene-2-methyl-6-julolidyl-9-enyl-4H-pyran) as non-polymeric emitters. Such non-polymeric emitters can be deposited by means of thermal evaporation, for example. Furthermore, it is possible to use polymer emitters, which can be deposited, in particular, by means of a wet-chemical method such as spin coating, for example.

The emitter materials can be embedded in a matrix material in a suitable manner.

It should be pointed out that other suitable emitter materials are likewise provided in other embodiments.

The emitter materials of the emitter layer(s) of the light emitting component 100 can be selected for example such that the light emitting component 100 emits white light. The emitter layer(s) may include a plurality of emitter materials that emit in different colors (for example blue and yellow or blue, green and red); alternatively, the emitter layer(s) can also be constructed from a plurality of partial layers, such as a blue fluorescent emitter layer or blue phosphorescent emitter layer, a green phosphorescent emitter layer and a red phosphorescent emitter layer. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation. Moreover, the emitter materials of different organic functional layer structures can be chosen such that although the individual emitter materials emit light of different colors (for example blue, green or red or arbitrary other color combinations, for example arbitrary other complementary color combinations), for example the overall light which is emitted overall by all the organic functional layer structure and is emitted toward the outside by the OLED is a light of predefined color, for example white light.

The organic functional layer structures 112, 116 can generally include one or a plurality of electroluminescent layers. The one or the plurality of electroluminescent layers may include organic polymers, organic oligomers, organic monomers, organic small, non-polymeric molecules ("small molecules") or a combination of these materials. By way of example, the organic electroluminescent layer structure 110 may include one or a plurality of electroluminescent layers embodied as a hole transport layer, so as to enable for example in the case of an OLED an effective hole injection into an electroluminescent layer or an electroluminescent region. Alternatively, in various embodiments, the organic functional layer structures 112, 116 may include one or a plurality of functional layers embodied as an electron transport layer, so as to enable for example in an OLED an effective electron injection into an electroluminescent layer or an electroluminescent region. By way of example, tertiary amines, carbazo derivatives, conductive polyaniline or polyethylene dioxythiophene can be used as material for the hole transport layer. In various embodiments, the one or the plurality of electroluminescent layers can be embodied as an electroluminescent layer.

The second electrode 108 (for example in the form of a second electrode layer 108) can be applied on or above the organic electroluminescent layer structure 110 or, if appropriate, on or above the one or the plurality of further organic functional layers, as described above.

In various embodiments, the second electrode 108 may include or be formed from the same materials as the first electrode 106, metals being particularly suitable in various embodiments.

In various embodiments, the second electrode 108 (for example for the case of a metallic second electrode 108) can have for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 108 can generally be formed in a similar manner to the first electrode 106, or differently than the latter. In various embodiments, the second electrode 108 can be formed from one or more of the materials and with the respective layer thickness as described above in connection with the first electrode 106. In various embodiments, both the first electrode 106 and the second electrode 108 are formed as translucent or transparent. Consequently, the light emitting component 100 illustrated in FIG. 1 can be designed as a top and bottom emitter (to put it another way as a transparent light emitting component 100).

The second electrode 108 can be formed as an anode, that is to say as a hole-injecting electrode, or as a cathode, that is to say as an electron-injecting electrode.

The second electrode 108 can have a second electrical terminal, to which a second electrical potential (which is different than the first electrical potential), provided by the energy source, can be applied. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

An encapsulation 118, for example in the form of a barrier thin-film layer/thin-film encapsulation 118, can optionally also be formed on or above the second electrode 108 and thus on or above the electrically active region 104.

In the context of this application, a "barrier thin-film layer" or a "barrier thin film" 118 can be understood to mean, for example, a layer or a layer structure which is suitable for forming a barrier against chemical impurities or atmospheric substances, in particular against water (moisture) and oxygen. In other words, the barrier thin-film layer 118 is formed in such a way that OLED-damaging substances such as water, oxygen or solvent cannot penetrate through it or at most very small proportions of said substances can penetrate through it.

In accordance with one configuration, the barrier thin-film layer 118 can be formed as an individual layer (to put it another way, as a single layer). In accordance with an alternative configuration, the barrier thin-film layer 118 may include a plurality of partial layers formed one on top of another. In other words, in accordance with one configuration, the barrier thin-film layer 118 can be formed as a layer stack. The barrier thin-film layer 118 or one or a plurality of partial layers of the barrier thin-film layer 118 can be formed for example by means of a suitable deposition method, e.g. by means of an atomic layer deposition (ALD) method in accordance with one configuration, e.g. a plasma enhanced atomic layer deposition (PEALD) method or a plasmaless atomic layer deposition (PLALD) method, or by means of a chemical vapor deposition (CVD) method in accordance with another configuration, e.g. a plasma enhanced chemical vapor deposition (PECVD) method or a plasmaless chemical vapor deposition (PLCVD) method, or alternatively by means of other suitable deposition methods.

By using an atomic layer deposition (ALD) method, it is possible for very thin layers to be deposited. In particular, layers having layer thicknesses in the atomic layer range can be deposited.

In accordance with one configuration, in the case of a barrier thin-film layer 118 having a plurality of partial layers, all the partial layers can be formed by means of an atomic layer deposition method. A layer sequence including only ALD layers can also be designated as a "nanolaminate".

In accordance with an alternative configuration, in the case of a barrier thin-film layer 118 including a plurality of partial layers, one or a plurality of partial layers of the barrier thin-film layer 118 can be deposited by means of a different deposition method than an atomic layer deposition method, for example by means of a vapor deposition method.

In accordance with one configuration, the barrier thin-film layer 118 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer 118 includes a plurality of partial layers, all the partial layers can have the same layer thickness. In accordance with another configuration, the individual partial layers of the barrier thin-film layer 118 can have different layer thicknesses. In other words, at least one of the partial layers can have a different layer thickness than one or more other partial layers.

In accordance with one configuration, the barrier thin-film layer 118 or the individual partial layers of the barrier thin-film layer 118 can be formed as a translucent or transparent layer. In other words, the barrier thin-film layer 118 (or the individual partial layers of the barrier thin-film layer 118) can consist of a translucent or transparent material (or a material combination that is translucent or transparent).

In accordance with one configuration, the barrier thin-film layer 118 or (in the case of a layer stack having a plurality of partial layers) one or a plurality of the partial layers of the barrier thin-film layer 118 may include or consist of one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various embodiments, the barrier thin-film layer 118 or (in the case of a layer stack having a plurality of partial layers) one or a plurality of the partial layers of the barrier thin-film layer 118 may include one or a plurality of high refractive index materials, to put it another way one or a plurality of materials having a high refractive index, for example having a refractive index of at least 2.

In various embodiments, on or above the encapsulation 118, it is possible to provide an adhesive and/or a protective lacquer 120, by means of which, for example, a cover 122 (for example a glass cover 122) is fixed, for example adhesively bonded, on the encapsulation 118. In various embodiments, the optically translucent layer composed of adhesive and/or protective lacquer 120 can have a layer thickness of greater than 1 µm, for example a layer thickness of several µm. In various embodiments, the adhesive may include or be a lamination adhesive.

In various embodiments, light-scattering particles can also be embedded into the layer of the adhesive (also designated as adhesive layer), which particles can lead to a further improvement in the color angle distortion and the coupling-out efficiency. In various embodiments, the light-scattering particles provided can be dielectric scattering particles, for example, such as metal oxides, for example, such as e.g. silicon oxide ($SiO_2$), zinc oxide (ZnO), zirconium oxide ($ZrO_2$), indium tin oxide (ITO) or indium zinc oxide (IZO), gallium oxide ($Ga_2O_a$), aluminum oxide, or titanium oxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like can be provided as light-scattering particles.

In various embodiments, between the second electrode 108 and the layer composed of adhesive and/or protective lacquer 120, an electrically insulating layer (not shown) can also be applied, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

Furthermore, it should be pointed out that, in various embodiments, an adhesive 120 can also be completely dispensed with, for example in embodiments in which the cover 122, for example composed of glass, is applied to the encapsulation 118 by means of plasma spraying, for example.

Furthermore, in various embodiments, one or a plurality of antireflective layers (for example combined with the encapsulation 118, for example the thin-film encapsulation 118) can additionally be provided in the light emitting component 100.

Figure 2:
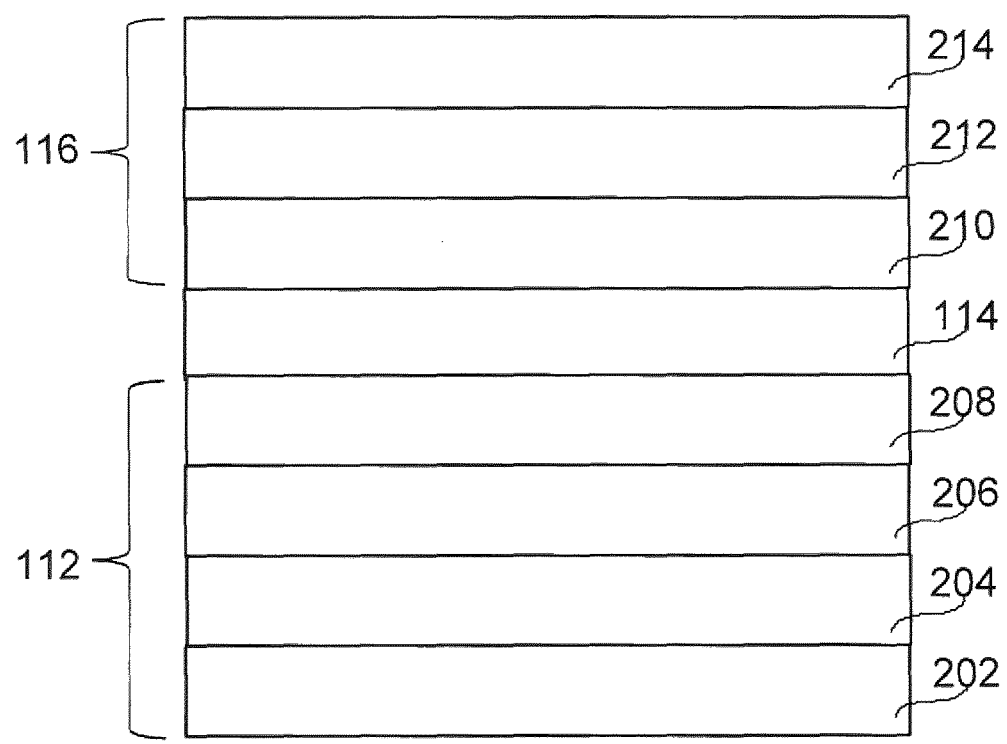
FIG. 2 shows a cross-sectional view of a functional layer system of an optoelectronic component in accordance with various embodiments.

As illustrated in FIG. 2, in various embodiments, the first organic functional layer structure 112 may include a hole injection layer 202, which can be applied, for example deposited, on or above the first electrode 106.

In various embodiments, the hole injection layer 202 may include or consist of one or more of the following materials:
HAT-CN, Cu(I)pFBz, $MoO_x$, $WO_x$, $VO_x$, $ReO_x$, F4-TCNQ, NDP-2, NDP-9, Bi(III)pFBz, F16CuPc, HTM014:Cu(II)pFBz, αNPD:$MoO_x$, PEDOT:PSS, HT508;
NPB (N,N'-bis(naphthalen-1-yl)-N,N'-bis(phenyl)benzidine);
beta-NPB (N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine);
spiro-NPB (N,N'-bis(naphthalen-1-yl)-N,N'-bis(phenyl) spiro); DMFL-TPD (N,N'-bis(3-methylphenyl)-N,N'-bis(phenyl)-9,9-dimethylfluorene);
DMFL-NPB (N,N'-bis(naphthalen-1-yl)-N,N'-bis(phenyl)-9,9-dimethylfluorene);
DPFL-TPD (N,N'-bis(3-methylphenyl)-N,N'-bis(phenyl)-9,9-diphenylfluorene);
DPFL-NPB (N,N'-bis(naphthalen-1-yl)-N,N'-bis(phenyl)-9,9-diphenylfluorene);
spiro-TAD (2,2',7,7'-tetrakis(N,N-diphenylamino)-9,9'-spirobifluorene);
9, 9-bis[4-(N,N-bis-biphenyl-4-yl-amino)phenyl]-9H-fluorene;

9,9-bis[4-(N,N-bis-naphthalen-2-yl-amino)phenyl]-9H-fluorene;
9,9-bis[4-(N,N-bis-naphthalen-2-yl-N,N-bis-phenylamino)phenyl]-9H-fluorene;
N,N'-bis(phenanthren-9-yl)-N,N'-bis(phenyl)benzidine;
2,7-bis[N,N-bis(9,9-spiro-bifluoren-2-yl)amino]-9,9-spiro-bifluorene;
2,2'-bis[N,N-bis(biphenyl-4-yl)amino]-9,9-spirobifluorene;
2,2'-bis(N,N-diphenylamino)-9,9-spirobifluorene;
di-[4-(N,N-ditolylamino)phenyl]cyclohexane;
2,2',7,7'-tetra(N,N-ditolyl)amino-spiro-bifluorene; and
N,N,N',N'-tetra-naphthalen-2-yl-benzidine.

The hole injection layer 202 can have a layer thickness in a range of approximately 10 nm to approximately 1000 nm, for example in a range of approximately 20 nm to approximately 500 nm, for example in a range of approximately 200 nm to approximately 400 nm, for example in a range of approximately 170 nm to approximately 330 nm.

A first hole transport layer 204 can be applied, for example deposited, on or above the hole injection layer 202. In various embodiments, the first hole transport layer 204 may include or consist of one or more of the following materials:
NPB (N,N'-bis(naphthalen-1-yl)-N,N'-bis(phenyl)benzidine);
beta-NPB (N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine);
spiro-NPB (N,N'-bis(naphthalen-1-yl)-N,N'-bis(phenyl) spiro); DMFL-TPD (N,N'-bis(3-methylphenyl)-N,N'-bis(phenyl)-9,9-dimethylfluorene);
DMFL-NPB (N,N'-bis(naphthalen-1-yl)-N,N'-bis(phenyl)-9,9-dimethylfluorene);
DPFL-TPD (N,N'-bis(3-methylphenyl)-N,N'-bis(phenyl)-9,9-diphenylfluorene);
DPFL-NPB (N,N'-bis(naphthalen-1-yl)-N,N'-bis(phenyl)-9,9-diphenylfluorene);
spiro-TAD (2,2',7,7'-tetrakis(N,N-diphenylamino)-9,9'-spirobifluorene);
9,9-bis[4-(N,N-bis-biphenyl-4-yl-amino)phenyl]-9H-fluorene;
9,9-bis[4-(N,N-bis-naphthalen-2-yl-amino)phenyl]-9H-fluorene;
9,9-bis[4-(N,N'-bis-naphthalen-2-yl-N,N'-bis-phenylamino)phenyl]-9H-fluorine;
N,N'-bis(phenanthren-9-yl)-N,N'-bis(phenyl)benzidine;
2,7-bis[N,N-bis(9,9-spirobifluoren-2-yl)amino]-9,9-spirobifluorene;
2,2'-bis[N,N-bis(biphenyl-4-yl)amino]-9,9-spirobifluorene;
2,2'-bis(N,N-diphenylamino)-9,9-spirobifluorene;
di-[4-(N,N-ditolylamino)phenyl]cyclohexane;
2,2',7,7'-tetra(N,N-ditolyl)amino-spiro-bifluorene; and
N,N,N',N'-tetra-naphthalen-2-yl-benzidine.

The first hole transport layer 204 can have a layer thickness in a range of approximately 5 nm to approximately 50 nm, for example in a range of approximately 10 nm to approximately 30 nm, for example approximately 20 nm.

A first emitter layer 206 can be applied, for example deposited, on or above the hole transport layer 204. The emitter materials which can be provided for example for the first emitter layer 206 are described above.

In various embodiments, the first emitter layer 206 can have a layer thickness in a range of approximately 5 nm to approximately 70 nm, for example in a range of approximately 10 nm to approximately 50 nm, for example approximately 30 nm.

Furthermore, a first electron transport layer 208 can be arranged, for example deposited, on or above the first emitter layer 206. In various embodiments, the first electron transport layer 208 may include or consist of one or more of the following materials:
NET-18
2,2',2"-(1,3,5-benzinetriyl)-tris(1-phenyl-1-H-benzimidazole);
2-(4-biphenylyl)-5-(4-tert-butylphenyl)-1,3,4-oxadiazole, 2,9-dimethyl-4,7-diphenyl-1,10-phenanthroline (BCP);
8-hydroxyquinolinolatolithium, 4-(naphthalen-1-yl)-3,5-diphenyl-4H-1,2,4-triazole;
1,3-bis[2-(2,2'-bipyridin-6-yl)-1,3,4-oxadiazo-5-yl]benzene;
4,7-diphenyl-1,10-phenanthroline (BPhen);
3-(4-biphenylyl)-4-phenyl-5-tert-butylphenyl-1,2,4-triazole;
bis(2-methyl-8-quinolinolate)-4-(phenylphenolato)aluminum;
6,6'-bis[5-(biphenyl-4-yl)-1,3,4-oxadiazo-2-yl]-2,2'-bipyridyl;
2-phenyl-9,10-di(naphthalen-2-yl)anthracene;
2,7-bis[2-(2,2'-bipyridin-6-yl)-1,3,4-oxadiazo-5-yl]-9,9-dimethylfluorene;
1,3-bis[2-(4-tert-butylphenyl)-1,3,4-oxadiazo-5-yl]benzene;
2-(naphthalen-2-yl)-4,7-diphenyl-1,10-phenanthroline;
2,9-bis(naphthalen-2-yl)-4,7-diphenyl-1,10-phenanthroline;
tris(2,4,6-trimethyl-3-(pyridin-3-yl)phenyl)borane;
1-methyl-2-(4-(naphthalen-2-yl)phenyl)-1H-imidazo[4,5-f][1,10]phenanthroline;
phenyl-dipyrenylphosphine oxide;
naphthalenetetracarboxylic dianhydride or the imides thereof;
perylenetetracarboxylic dianhydride or the imides thereof; and
substances based on silols including a silacyclopentadiene unit.

The first electron transport layer 208 can have a layer thickness in a range of approximately 5 nm to approximately 50 nm, for example in a range of approximately 10 nm to approximately 30 nm, for example approximately 20 nm.

Furthermore, a first electron transport layer 208 can be arranged, for example deposited, on or above the first emitter layer 206. In various embodiments, the first electron transport layer 208 may include or consist of one or more of the following materials:
NET-18, NET-5, ETM033, ETM036, BCP, BPhen;
2,2',2"-(1,3,5-benzinetriyl)-tris(1-phenyl-1-H-benzimidazole);
2-(4-biphenylyl)-5-(4-tert-butylphenyl)-1,3,4-oxadiazole, 2,9-dimethyl-4,7-diphenyl-1,10-phenanthroline (BCP);
8-hydroxyquinolinolatolithium, 4-(naphthalen-1-yl)-3,5-diphenyl-4H-1,2,4-triazole;
1,3-bis[2-(2,2'-bipyridin-6-yl)-1,3,4-oxadiazo-5-yl]benzene;
4,7-diphenyl-1,10-phenanthroline (BPhen);
3-(4-biphenylyl)-4-phenyl-5-tert-butylphenyl-1,2,4-triazole;
bis(2-methyl-8-quinolinolate)-4-(phenylphenolato)aluminum;
6,6'-bis[5-(biphenyl-4-yl)-1,3,4-oxadiazo-2-yl]-2,2'-bipyridyl;
2-phenyl-9,10-di(naphthalen-2-yl)anthracene;

2,7-bis[2-(2,2'-bipyridin-6-yl)-1,3,4-oxadiazo-5-yl]-9,9-dimethylfluorene;
1,3-bis[2-(4-tert-butylphenyl)-1,3,4-oxadiazo-5-yl]benzene;
2-(naphthalen-2-yl)-4,7-diphenyl-1,10-phenanthroline;
2,9-bis(naphthalen-2-yl)-4,7-diphenyl-1,10-phenanthroline;
tris(2,4,6-trimethyl-3-(pyridin-3-yl)phenyl)borane;
1-methyl-2-(4-(naphthalen-2-yl)phenyl)-1H-imidazo[4,5-f][1,10]phenanthroline;
phenyl-dipyrenylphosphine oxide;
naphthalenetetracarboxylic dianhydride or the imides thereof;
perylenetetracarboxylic dianhydride or the imides thereof; and
substances based on silols including a silacyclopentadiene unit.

The first electron transport layer 208 can have a layer thickness in a range of approximately 10 nm to approximately 50 nm, for example in a range of approximately 15 nm to approximately 40 nm, for example in a range of approximately 20 nm to approximately 30 nm.

As described above, the (optional) hole injection layer 202, the (optional) first hole transport layer 204, the first emitter layer 106, and the (optional) first electron transport layer 208 form the first organic functional layer structure 112.

A charge generating layer structure (CGL) 114 is arranged on or above the first organic functional layer structure 112, and will be described in even greater detail below.

In various embodiments, the second organic functional layer structure 116 can be arranged on or above the charge generating layer structure 114.

In various embodiments, the second organic functional layer structure 116 may include a second hole transport layer 310 (not illustrated), wherein the second hole transport layer 310 can also be designated as hole-conducting charge generating layer 310 and is arranged as part of the charge generating layer structure 114. By way of example, the second hole transport layer 310 can be in physical contact 308 with the first electron-conducting charge generating layer structure 306; to put it another way, they share a common interface.

In various embodiments, the second hole transport layer 310 or hole-conducting charge generating layer 310 may include or consist of one or a plurality of the following materials or a stoichiometric variant of said compound: BaCuSF, BaCuTeF, NiO, Cu-containing delafossites, for example $CuMO_2$ (M=trivalent cation, for example Al, Ga, In, or the like), $CuO_2$, $CuY_{1-x}Ca_xO_2$, $CuCr_{1-x}Mg_xO_2$, $ZnM_2O_4$ (M=Co, Rh, Rh, Ir, or the like), $SrCu_2O_2$, LaCuOM (M=S, Se, Te, or the like) or else Mg-doped $CuCrO_2$.

Suitable methods for producing the hole conductor layers including these substances include pulsed laser deposition at room temperature, sputtering at low temperatures or pulsed magnetron sputtering.

The second hole transport layer 310 can have a layer thickness in a range of approximately 10 nm to approximately 50 nm, for example in a range of approximately 15 nm to approximately 40 nm, for example in a range of approximately 20 nm to approximately 30 nm.

Furthermore, the second organic functional layer structure 116 may include a second emitter layer 210, which can be arranged on or above the second hole transport layer 310. The second emitter layer 210 may include the same emitter materials as the first emitter layer 206. Alternatively, the second emitter layer 210 and the first emitter layer 206 may include different emitter materials. In various embodiments, the second emitter layer 210 can be designed in such a way that it emits electromagnetic radiation, for example visible light, having the same wavelength(s) as the first emitter layer 206. Alternatively, the second emitter layer 210 can be designed in such a way that it emits electromagnetic radiation, for example visible light, having a different wavelength or different wavelengths than the first emitter layer 206. The emitter materials of the second emitter layer can be materials such as have been described above.

Other suitable emitter materials can, of course, be provided both for the first emitter layer 206 and for the second emitter layer 210.

Furthermore, the second organic functional layer structure 116 may include a second electron transport layer 212, which can be arranged, for example deposited, on or above the second emitter layer 210.

In various embodiments, the second electron transport layer 212 may include or consist of one or more of the following materials:
NET-18, NET-5, ETM033, ETM036, BCP, BPhen;
2,2',2"-(1,3,5-benzinetriyl)-tris(1-phenyl-1-H-benzimidazole);
2-(4-biphenylyl)-5-(4-tert-butylphenyl)-1,3,4-oxadiazole, 2,9-dimethyl-4,7-diphenyl-1,10-phenanthroline (BCP);
8-hydroxyquinolinolatolithium, 4-(naphthalen-1-yl)-3,5-diphenyl-4H-1,2,4-triazole;
1,3-bis[2-(2,2'-bipyridin-6-yl)-1,3,4-oxadiazo-5-yl]benzene;
4,7-diphenyl-1,10-phenanthroline (BPhen);
3-(4-biphenylyl)-4-phenyl-5-tert-butylphenyl-1,2,4-triazole;
bis(2-methyl-8-quinolinolato)-4-(phenylphenolato)aluminum;
6,6'-bis[5-(biphenyl-4-yl)-1,3,4-oxadiazo-2-yl]-2,2'-bipyridyl;
2-phenyl-9,10-di(naphthalen-2-yl)anthracene;
2,7-bis[2-(2,2'-bipyridin-6-yl)-1,3,4-oxadiazo-5-yl]-9,9-dimethylfluorene;
1,3-bis[2-(4-tert-butylphenyl)-1,3,4-oxadiazo-5-yl]benzene;
2-(naphthalen-2-yl)-4,7-diphenyl-1,10-phenanthroline;
2,9-bis(naphthalen-2-yl)-4,7-diphenyl-1,10-phenanthroline;
tris(2,4,6-trimethyl-3-(pyridin-3-yl)phenyl)borane;
1-methyl-2-(4-(naphthalen-2-yl)phenyl)-1H-imidazo[4,5-f][1,10]phenanthroline;
phenyl-dipyrenylphosphine oxide;
naphthalenetetracarboxylic dianhydride or the imides thereof;
perylenetetracarboxylic dianhydride or the imides thereof; and
substances based on silols including a silacyclopentadiene unit.

The second electron transport layer 212 can have a layer thickness in a range of approximately 10 nm to approximately 50 nm, for example in a range of approximately 15 nm to approximately 40 nm, for example in a range of approximately 20 nm to approximately 30 nm.

Furthermore, an electron injection layer 214 can be applied, for example deposited, on or above the second electron transport layer 212.

In various embodiments, the electron injection layer 214 may include or consist of one or more of the following materials:
NDN-26, MgAg, $Cs_2CO_3$, $Cs_3PO_4$, Na, Ca, K, Mg, Cs, Li, LiF;
2,2',2"-(1,3,5-benzinetriyl)-tris(1-phenyl-1-H-benzimidazole);
2-(4-biphenylyl)-5-(4-tert-butylphenyl)-1,3,4-oxadiazole, 2,9-dimethyl-4,7-diphenyl-1,10-phenanthroline (BCP);

8-hydroxyquinolinolatolithium, 4-(naphthalen-1-yl)-3,5-diphenyl-4H-1,2,4-triazole;
1,3-bis[2-(2,2'-bipyridin-6-yl)-1,3,4-oxadiazo-5-yl]benzene;
4,7-diphenyl-1,10-phenanthroline (BPhen);
3-(4-biphenylyl)-4-phenyl-5-tert-butylphenyl-1,2,4-triazole;
bis(2-methyl-8-quinolinolate)-4-(phenylphenolato)aluminum;
6,6'-bis[5-(biphenyl-4-yl)-1,3,4-oxadiazo-2-yl]-2,2'-bipyridyl;
2-phenyl-9,10-di(naphthalen-2-yl)anthracene;
2,7-bis[2-(2,2'-bipyridin-6-yl)-1,3,4-oxadiazo-5-yl]-9,9-dimethylfluorene;
1,3-bis[2-(4-tert-butylphenyl)-1,3,4-oxadiazo-5-yl]benzene;
2-(naphthalen-2-yl)-4,7-diphenyl-1,10-phenanthroline;
2,9-bis(naphthalen-2-yl)-4,7-diphenyl-1,10-phenanthroline;
tris(2,4,6-trimethyl-3-(pyridin-3-yl)phenyl)borane;
1-methyl-2-(4-(naphthalen-2-yl)phenyl)-1H-imidazo[4,5-f][1,10]phenanthroline;
phenyl-dipyrenylphosphine oxide;
naphthalenetetracarboxylic dianhydride or the imides thereof;
perylenetetracarboxylic dianhydride or the imides thereof; and
substances based on silols including a silacyclopentadiene unit.

The electron injection layer 214 can have a layer thickness in a range of approximately 5 nm to approximately 200 nm, for example in a range of approximately 20 nm to approximately 50 nm, for example approximately 40 nm.

As described above, the (optional) second hole transport layer 310, the second emitter layer 210, the (optional) second electron transport layer 212, and the (optional) electron injection layer 214 form the second organic functional layer structure 116.

In various embodiments, the organic electroluminescent layer structure 110 (that is to say for example the sum of the thicknesses of hole transport layer(s) and emitter layer(s) and electron transport layer(s), etc.) can have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 110 can have for example a stack of a plurality of organic light emitting diodes (OLEDs) arranged directly one above another, wherein each OLED can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 110 can have for example a stack of two, three or four OLEDs arranged directly one above another, in which case for example the organic electroluminescent layer structure 110 can have a layer thickness of a maximum of approximately 3 µm.

The light emitting component 100 can optionally generally include further organic functional layers, for example arranged on or above the one or the plurality of emitter layers or on or above the electron transport layer(s), which organic functional layers serve to further improve the functionality and thus the efficiency of the light emitting component 100.

The second electrode 108 (for example in the form of a second electrode layer 108) can be applied on or above the organic electroluminescent layer structure 110 or, if appropriate, on or above the one or the plurality of further organic functional layers, as described above.

Figure 3:
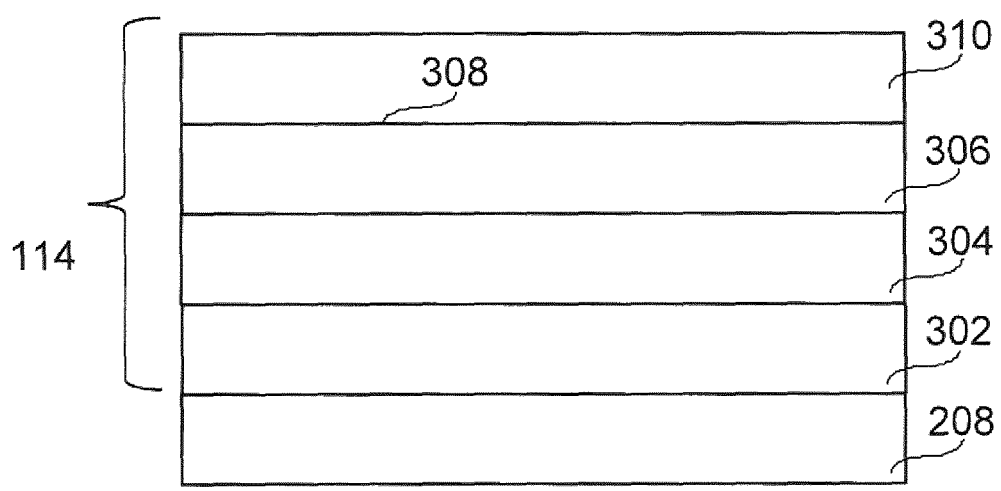
FIG. 3 shows a cross-sectional view of a charge generating layer structure of an optoelectronic component in accordance with various embodiments.

FIG. 3 illustrates the construction of a charge generating layer 114 in accordance with various embodiments in a cross-sectional view.

In various embodiments, the charge generating layer structure 114 may include a hole-conducting charge generating layer 310, a first electron-conducting charge generating layer 306 and a second electron-conducting charge generating layer 302, wherein the second electron-conducting charge generating layer 302 can be arranged on or above the first electron transport layer 208, for example can be in physical contact with the latter.

The first electron-conducting charge generating layer 306 can be arranged on or above the first electron-conducting charge generating layer 302, wherein an interlayer 304 can optionally be provided between these two layers 302, 306.

The second hole transport layer 310 or the hole-conducting charge generating layer 310 can be arranged on or above the first electron-conducting charge generating layer 306 and is in physical contact therewith (designated by reference sign 308 in FIG. 3).

The second hole transport layer 310 can also be designed or understood as hole-conducting charge generating layer 310 by virtue of charge carrier pairs being separated at the common interface 308 of the first electron-conducting charge generating layer 306 with the hole transport layer 310.

In various embodiments, the charge generating layer structure 114 can be augmented by the interlayer 304 between the electron-conducting charge generating layers 302, 306, in order to alter the profile of the band structure.

By way of example, the interlayer 304 can generate states in the band gap of the charge generating layers 302, 306 and facilitate separation of the charge carrier pairs.

The interlayer 304 can furthermore prevent layer interdiffusion of the dopant or of the matrix substance, for example.

Unlike in the case of inorganic layer sequences in semiconductor components, organic layers can partially interdiffuse into other organic layers (partial layer interdiffusion), e.g. organic parts of the second electron-conducting charge generating layer 302 into an organic first electron-conducting charge generating layer 306 of a charge generating layer structure in an optoelectronic component 100, for example an OLED.

In order to suppress the partial layer interdiffusion (that is to say illustratively to achieve a barrier effect) the interlayer 304 can be inserted between the individual organic layers, e.g. between the first electron-conducting charge generating layer 306 and the second electron-conducting charge generating layer 302, or one of the layers, i.e. the second electron-conducting charge generating layer 302 and/or the first electron-conducting charge generating layer 306, may include or consist of an inorganic substance.

Furthermore, the interlayer can prevent the first electron-conducting charge generating layer 306 from reacting with the second electron-conducting charge generating layer 302, i.e. the interlayer 304 can form a reaction barrier.

Furthermore, the interlayer 304 can reduce the interface roughness between the first electron-conducting charge generating layer 306 and the second electron-conducting charge generating layer 302 by virtue of the surface roughness of the first electron-conducting charge generating layer being reduced or compensated by means of the interlayer 304.

In various embodiments, the second electron-conducting charge generating layer 302 can be composed of a plurality of substances, that is to say a substance mixture, for example, or of a single substance (for this reason, the second electron-conducting charge generating layer 302 can also be designated as an undoped second electron-conducting charge generating layer 302).

The substance forming the second electron-conducting charge generating layer 302, that is to say for example the substance of which the second electron-conducting charge generating layer 302 consists, can have a high electron conductivity (for example an electron conductivity of an order of magnitude of for example better than approximately $10^{-7}$ S/m, for example better than approximately $10^{-6}$ S/m, for example better than approximately $10^{-5}$ S/m).

Furthermore, the substance of the second electron-conducting charge generating layer 302 can have a low work function (for example a work function of less than or equal to approximately 3 eV) and a low absorption of visible light. In various embodiments, as substance of the second electron-conducting charge generating layer 302 it is possible to provide any substance which fulfills these stated conditions, for example a NET-18 matrix with NDN-26 dopant (substance mixture) or NDN-26, MgAg, $Cs_2CO_3$, $Cs_3PO_4$, Na, Ca, K, Mg, Cs, Li, LiF (substance).

In various embodiments, the second electron-conducting charge generating layer 302 can have a layer thickness in a range of approximately 1 nm to approximately 500 nm, for example in a range of approximately 3 nm to approximately 100 nm, for example in a range of approximately 10 nm to approximately 90 nm, for example in a range of approximately 20 nm to approximately 80 nm, for example in a range of approximately 30 nm to approximately 70 nm, for example in a range of approximately 40 nm to approximately 60 nm, for example a layer thickness of approximately 50 nm.

In various embodiments, the first electron-conducting charge generating layer 306 can be composed of a plurality of substances, that is to say for example a substance mixture, or likewise of a single substance (for this reason, the first electron-conducting charge generating layer 306 can also be designated as an undoped first electron-conducting charge generating layer 306).

The substance forming the first electron-conducting charge generating layer 306, that is to say for example the substance of which the first electron-conducting charge generating layer 306 consists, can have a high conductivity (for example a conductivity of an order of magnitude of for example better than approximately $10^{-5}$ S/m, for example better than approximately $10^{-4}$ S/m, for example better than approximately $10^{-3}$ S/m). Furthermore, the substance of the first electron-conducting charge generating layer 306 can have a high work function, for example a work function in a range of approximately 3.5 eV to approximately 5.5 eV, for example in a range of approximately 4.4 eV to approximately 5.5 eV, and a low absorption of visible light. In various embodiments, as substance of the first electron-conducting charge generating layer 306 it is possible to provide any material or any substance which fulfills these stated conditions, for example HAT-CN, Cu(I)pFBz, $MoO_x$, $WO_x$, $VO_x$, $ReO_x$, F4-TCNQ, NDP-2, NDP-9, Bi(III)pFBz, F16CuPc.

In various embodiments, the first electron-conducting charge generating layer 306 can have a layer thickness in a range of approximately 1 nm to approximately 500 nm, for example in a range of approximately 3 nm to approximately 100 nm, for example in a range of approximately 10 nm to approximately 90 nm, for example in a range of approximately 20 nm to approximately 80 nm, for example in a range of approximately 30 nm to approximately 70 nm, for example in a range of approximately 40 nm to approximately 60 nm, for example a layer thickness of approximately 50 nm.

In various embodiments, the first electron-conducting charge generating layer 306 may include a substance or substance mixture having high conductivity and a conduction band (Lowest Unoccupied Molecule Orbital, LUMO) which is energetically approximately equal relative to the valence band (Highest Occupied Molecule Orbital, HOMO) of the directly or indirectly adjacent hole transport layer 310 or hole-conducting charge generating layer 310 and the valence band of the second electron-conducting charge generating layer 302. To put it another way, the substance or the substance mixture of the first electron-conducting charge generating layer 306 has a LUMO that is energetically approximately at the same level as the HOMO of the substance or substance mixture of the hole transport layer 310 and the HOMO of the second electron-conducting charge generating layer 302.

The charge carrier pair is generated and separated at the common interface 308 of the hole transport layer 310 with the first electron-conducting charge generating layer 306 in such a way that the hole of the charge carrier pair generated is transported in the hole transport layer 310 to the emitter layer 210 of the second organic functional layer structure 116, and wherein the electron of the charge carrier pair generated is transported by means of the first electron-conducting charge generating layer 306 and second charge generating layer 302 to the first emitter layer 206 of the first organic functional layer structure 112. In other words, the hole transport layer 310 can additionally be designed as a hole-conducting charge generating layer 310.

The interlayer 304 can have a layer thickness in a range of approximately 1 nm to approximately 200 nm, for example in a range of approximately 3 nm to approximately 100 nm, for example in a range of approximately 5 nm to approximately 10 nm, for example a layer thickness of approximately 6 nm. The charge carrier conduction through the interlayer 304 can take place directly or indirectly.

The substance or the substance mixture of the interlayer 304 can be an electrical insulator in the case of an indirect charge carrier conduction. The HOMO of the electrically insulating substance of the interlayer 304 can be higher than the LUMO of the directly adjacent first electron-conducting charge generating layer 306 and higher than the HOMO of the directly adjacent second electron-conducting charge generating layer 302. A tunneling current through the interlayer 304 can be effected as a result.

Suitable substance for the interlayer 304 may be, for example: NET-39, phthalocyanine derivatives, for example unsubstituted phthalocyanine; for example metal oxide phthalocyanine compounds, for example vanadium oxide phthalocyanine (VOPc), titanium oxide phthalocyanine (TiOPc); for example metal phthalocyanine derivatives, for example copper phthalocyanine (CuPc), ($H_2Pc$), cobalt phthalocyanine (CoPc), aluminum phthalocyanine (AlPc), nickel phthalocyanine (NiPc), iron phthalocyanine (FePc), zinc phthalocyanine (ZnPc) or manganese phthalocyanine (MnPC).

In a first specific implementation of various embodiments, which, however, is not intended to be of any restrictive character whatsoever, the layer structure described above may include the following layers:
electron transport layer 208:
NET-18 having a layer thickness of approximately 10 nm;
second electron-conducting charge generating layer 302:
NET-18 doped with NDN-26, for example having a concentration of approximately 8% relative to the volume of the substance mixture, having a layer thickness of approximately 50 nm; and
first electron-conducting charge generating layer 306:
HAT-CN having a layer thickness of approximately 5 nm;
hole transport layer 310:
$CuGaO_2$ having a layer thickness of approximately 50 nm.

In a second specific implementation of various embodiments, which, however, is not intended to be of any restrictive character whatsoever, the charge generating layer structure 114 with adjoining hole transport layer 310 and electron transport layer 208 includes the following layers:
electron transport layer 208:
NET-18 having a layer thickness of approximately 10 nm;
second electron-conducting charge generating layer 302:
NET-18 doped with NDN-26, for example having a concentration of approximately 8% relative to the volume of the substance mixture, having a layer thickness of approximately 50 nm; and
first electron-conducting charge generating layer 306:
HAT-CN having a layer thickness of approximately 5 nm;
hole transport layer 310:
$SrCu_2O_2$ having a layer thickness of approximately 50 nm.

One advantage of this approach in accordance with various embodiments can be seen in that owing to the use of a transparent, inorganic, intrinsically hole-conducting substance or transparent, inorganic, intrinsically hole-conducting substance mixture for the hole transport layer, optoelectronic components can become thermally stabler and more efficient and can withstand higher field strengths, for example voltage spikes when the optoelectronic component is switched on or in the case of an excessive increase in current. The inorganic substances or substance mixtures used for the hole transport layer, compared with previously used organic substance or substance mixtures, are distinguished by a high achievable charge carrier density, low work function and often strong interface dipoles. The latter lead to a high built-in voltage and expedient band matching for the charge carrier separation at the interface of the hole transport layer with the first electron-conducting charge generating layer. This reduces the voltage drop across the hole transport layer and thus increases the efficiency of the optoelectronic component. In the case of a conventional organic hole transport layer, moreover, layer interdiffusion occurs at the organic-organic interface of the hole transport layer with the first electron-conducting charge generating layer, for example in the case of the frequently used cNPD having a relatively low glass transition temperature as organic substance of the hole transport layer. This increasingly reduces the current density with applied voltage as the operating time increases. The operating period of the optoelectronic component is reduced as a result.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component, comprising:
a first organic functional layer structure;
a second organic functional layer structure; and
a charge generating layer structure between the first organic functional layer structure and the second organic functional layer structure,
wherein the charge generating layer structure comprises a hole-conducting charge generating layer and a first electron-conducting charge generating layer; and
wherein the hole-conducting charge generating layer comprises or is formed from an inorganic substance or an inorganic substance mixture, and wherein the first electron-conducting charge generating layer comprises or is formed from an organic substance or an organic substance mixture;
wherein the first electron-conducting charge generating layer comprises or is formed from an organic, intrinsically electron-conducting substance, and wherein more than half of freely mobile charge carriers of the first electron-conducting charge generating layer are electrons.

2. The optoelectronic component as claimed in claim 1, further comprising a second electron-conducting charge generating layer on or above the first electron-conducting charge generating layer.

3. The optoelectronic component as claimed in claim 2, further comprising:
an interlayer between the first electron-conducting charge generating layer and the second electron-conducting charge generating layer.

4. The optoelectronic component as claimed in claim 1, wherein the inorganic hole-conducting substance of the hole-conducting charge generating layer comprises or is formed from an inorganic, intrinsically hole-conducting substance.

5. The optoelectronic component as claimed in claim 4, wherein the inorganic, intrinsically hole-conducting substance of the hole-conducting charge generating layer comprises or is formed from BaCuSF, BaCuSeF and/or BaCuTeF or a stoichiometric variant of said compounds.

6. The optoelectronic component as claimed in claim 4, wherein the inorganic, intrinsically hole-conducting substance of the hole-conducting charge generating layer comprises or is formed from NiO and/or $AgCoO_2$ or a stoichiometric variant of said compound.

7. The optoelectronic component as claimed in claim 4, wherein the inorganic, intrinsically hole-conducting substance of the hole-conducting charge generating layer comprises or is formed from one or a plurality of copper-containing delafossites.

8. The optoelectronic component as claimed in claim 7, wherein the copper-containing delafossite or the copper-containing delafossites comprises or comprise or is or are formed from one or a plurality of substances of the substance group of $CuAlO_2$, $CuGaO_2$, $CuInO_2$, $CuTlO_2$, $CuY_{1-x}Ca_xO_2$, $CuCr_{1-x}Mg_xO_2$ and/or $CuO_2$ or a stoichiometric variant of said compounds.

9. The optoelectronic component as claimed in claim 4, wherein the inorganic, intrinsically hole-conducting substance of the hole-conducting charge generating layer comprises or is formed from one or a plurality of substances of the substance group $ZnCo_2O_4$, $ZnRh_2O_4$ and/or $ZnIr_2O_4$ or a stoichiometric variant of said compounds.

10. The optoelectronic component as claimed in claim 4, wherein the inorganic, intrinsically hole-conducting substance of the hole-conducting charge generating layer comprises or is formed from $SrCu_2O_2$ or a stoichiometric variant of said compound.

11. The optoelectronic component as claimed in claim 4, wherein the inorganic, intrinsically hole-conducting substance of the hole-conducting charge generating layer comprises or is formed from one or a plurality of substances of the substance group LaCuOS, LaCuOSe and/or LaCuOTe or a stoichiometric variant of said compound.

12. The optoelectronic component as claimed in claim 1, wherein the first electron-conducting charge generating layer comprises an organic, intrinsically electron-conducting substance from the group of substances: HAT-CN, Cu(I)pFBz, F4-TCNQ, NDP-2, NDP-9, Bi(III)pFBz, F16CuPc or an intrinsically electron-conducting metal oxide substance from the group of: $MoO_x$, $WO_x$, $VO_x$, $ReO_x$.

13. The optoelectronic component as claimed in claim 1, wherein the optoelectronic component is embodied as an organic light-emitting diode.

14. A method for producing an optoelectronic component, the method comprising:
   forming a first organic functional layer structure;
   forming a charge generating layer structure above or on the first organic functional layer structure;
      forming a second organic functional layer structure above or on the charge generating layer structure;
      wherein forming the charge generating layer structure comprises forming a hole-conducting charge generating layer and forming a first electron-conducting charge generating layer; wherein the hole-conducting charge generating layer comprises or is formed from an inorganic substance or an inorganic substance mixture, and wherein the first electron-conducting charge generating layer comprises or is formed from an organic, intrinsically electron-conducting substance or an organic, intrinsically electron-conducting substance mixture, and wherein more than half of freely mobile charge carriers of the first electron-conducting charge generating layer are electrons.

15. The method as claimed in claim 14,
wherein the forming the hole-conducting charge generating layer by means of depositing the inorganic hole-conducting substance or the inorganic hole-conducting substance mixture is performed at a temperature of less than approximately 100° C.

16. The method as claimed in claim 14,
wherein the optoelectronic component is produced as an organic light emitting diode.

* * * * *

UNITED STATES PATENT AND TRADEMARK OFFICE
CERTIFICATE OF CORRECTION

PATENT NO. : 9,685,624 B2
APPLICATION NO. : 14/419945
DATED : June 20, 2017
INVENTOR(S) : Thilo Reusch et al.

It is certified that error appears in the above-identified patent and that said Letters Patent is hereby corrected as shown below:

In the Specification

Column 6, Line 52: Please delete "WoO$_x$" and write as follows -- WO$_x$ --.

Column 13, Line 12: Please delete "Zn$_2$Sn$_2$O$_5$" and write as follows -- Zn$_2$In$_2$O$_5$ --.

Column 19, Line 3: Please delete "N,N" between "4-(" and "-bis" and write -- N,N' -- in place thereof.

Column 19, Line 3: Please delete "N,N" between "2-yl-" and "-bis" and write -- N,N' -- in place thereof.

Column 27, Line 64: Please delete "cNPD" and write -- αNPD -- in place thereof.

Signed and Sealed this
Third Day of October, 2017

Joseph Matal
*Performing the Functions and Duties of the*
*Under Secretary of Commerce for Intellectual Property and*
*Director of the United States Patent and Trademark Office*